(12) United States Patent
Tanaka et al.

(10) Patent No.: US 8,978,671 B2
(45) Date of Patent: Mar. 17, 2015

(54) SUBSTRATE PROCESSING METHOD AND SUBSTRATE PROCESSING APPARATUS

(75) Inventors: Satoru Tanaka, Koshi (JP); Takehiko Orii, Nirasaki (JP); Hirotaka Maruyama, Koshi (JP); Teruomi Minami, Koshi (JP); Mitsunori Nakamori, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 615 days.

(21) Appl. No.: 13/332,652

(22) Filed: Dec. 21, 2011

(65) Prior Publication Data

US 2012/0164840 A1  Jun. 28, 2012

(30) Foreign Application Priority Data

Dec. 24, 2010 (JP) .................................. 2010-288614
Oct. 7, 2011 (JP) .................................. 2011-223208

(51) Int. Cl.
*B08B 3/00* (2006.01)
*H01L 21/67* (2006.01)

(52) U.S. Cl.
CPC .... *H01L 21/67028* (2013.01); *H01L 21/67051* (2013.01)
USPC ....... 134/94.1; 134/105; 134/56 R; 134/57 R; 134/95.1; 134/95.2; 156/345.15

(58) Field of Classification Search
None
See application file for complete search history.

(56) References Cited

FOREIGN PATENT DOCUMENTS

| JP | 2002-009035 A | 1/2002 |
| JP | 2005-166957 A | 6/2005 |
| JP | 2007-227467 A | 9/2007 |
| JP | 2008-041873 A | 2/2008 |
| JP | 2009-200193 A | 9/2009 |
| JP | 2010-528470 A | 8/2010 |
| KR | 10-2010-0046794 A | 5/2010 |

*Primary Examiner* — Eric Golightly
(74) *Attorney, Agent, or Firm* — Abelman, Frayne & Schwab

(57) ABSTRACT

An apparatus comprising: a processing liquid supply unit; a volatile processing liquid supply unit; a substrate heating unit; and a controller to control the volatile processing liquid supply unit and the substrate heating unit, wherein the controller executes a process of supplying the processing liquid to the substrate, a process of heating the substrate on which a liquid film of the processing liquid is formed, a process of supplying a volatile processing liquid, a process of stopping the supply of the volatile processing liquid, and a process of drying the substrate by removing the volatile processing liquid, and wherein the process of heating the substrate starts before the process of supplying the volatile processing liquid, and the substrate heating unit heats the substrate so that the surface temperature of the substrate is higher than a dew point before the surface of the substrate is exposed from the volatile processing liquid.

8 Claims, 6 Drawing Sheets

SUBSTRATE PROCESSING METHOD AND SUBSTRATE PROCESSING APPARATUS

CROSS-REFERENCE TO RELATED APPLICATIONS

This application is based on and claims priority from Japanese Patent Applications Nos. 2010-288614 and 2011-223208, filed on Dec. 24, 2010 and Oct. 7, 2011, respectively, with the Japanese Patent Office, the disclosures of which are incorporated herein in their entireties by reference.

TECHNICAL FIELD

The present disclosure relates to a substrate processing method and a substrate processing apparatus in which a substrate is dried by a volatile processing liquid after the substrate is processed with a processing liquid.

BACKGROUND

In the related art, when a semiconductor component or a flat panel display is manufactured, a substrate processing apparatus is used to perform a liquid processing onto a substrate such as a semiconductor wafer or a liquid crystal substrate, with various kinds of processing liquids, and thereafter, perform a drying processing of drying the substrate attached with the processing liquid. Herein, the liquid processing by a processing liquid in the liquid processing apparatus includes cleaning or etching of the surface of a substrate with a chemical liquid such as a cleaning liquid or an etching liquid, or rinsing of the surface of the cleaned or etched substrate with a rinse liquid such as deionized water (DIW).

In the drying processing of the substrate processing, a volatile chemical liquid such as isopropyl alcohol (IPA) is used as a drying liquid, and a volatile processing liquid is ejected to the surface of the substrate to substitute a rinse liquid or the like, thereby rapidly drying the substrate (see, e.g., Japanese Patent Application Laid-Open No. 2007-227467, incorporated herein by reference).

SUMMARY

An exemplary embodiment of the present disclosure provides a substrate processing method for drying a substrate by supplying a volatile processing liquid after a liquid processing of the substrate with a processing liquid, the method comprising: supplying a processing liquid onto a substrate to process the substrate; heating the substrate on which a liquid film of the processing liquid is formed; supplying a volatile processing liquid to the substrate on which the liquid film of the processing liquid is formed; stopping the supply of the volatile processing liquid to the substrate; and drying the substrate by removing the volatile processing liquid. In particular, the heating of the substrate starts before the supplying of the volatile processing liquid, and the substrate is heated so that the surface temperature of the substrate is higher than a dew point before the surface of the substrate is exposed from the volatile processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
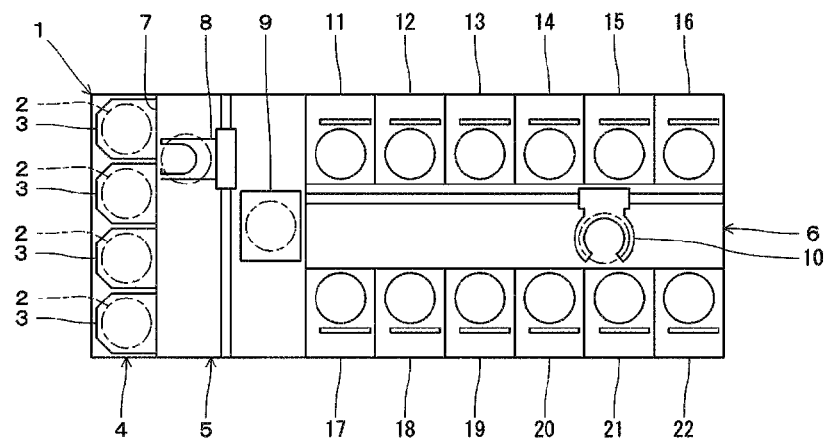
FIG. 1 is a plan view illustrating a substrate processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In recent years, due to minuteness of a circuit pattern or an etching mask pattern formed on the surface of a substrate, minute particles remaining on the surface of the substrate in the substrate processing have been a problem. In the conventional substrate processing as described above, due to evaporation of the volatile processing liquid used in the drying processing, the substrate is cooled and the moisture within the air is condensed on the substrate to generate a watermark, such that minute particles may be attached to the surface of the substrate which is problematic.

For this reason, a substrate processing is performed, in which a large amount of dry air is blown into a substrate processing apparatus where a substrate is dried with a volatile processing liquid under a low humidity environment.

However, since the conventional substrate processing of the related art needs the dry air, operating costs for the substrate processing increase.

An exemplary embodiment of the present disclosure provides a substrate processing method that dries a substrate by supplying a volatile processing liquid after liquid processing of the substrate with a processing liquid, the method comprising: supplying a processing liquid onto a substrate to process the substrate; heating the substrate on which a liquid film of the processing liquid is formed; supplying a volatile processing liquid to the substrate on which the liquid film of the processing liquid is formed; stopping the supply of the volatile processing liquid to the substrate; and drying the substrate by removing the volatile processing liquid. In particular, the heating process starts before the process of supplying the volatile processing liquid, and the substrate is heated so that the surface temperature of the substrate is higher than a dew point before the surface of the substrate is exposed from the volatile processing liquid.

In the above substrate processing method, the processing liquid may be a rinse liquid to rinse the substrate, the substrate processing method further comprising processing the substrate with a chemical liquid before rinsing substrate, and the substrate may be heated by using a high-temperature rinse liquid in the heating of the substrate.

In the above substrate processing method, the heating of the substrate may supply the high-temperature rinse liquid to the top surface of the substrate.

In the above substrate processing method, the heating of the substrate may supply the high-temperature rinse liquid to the top surface and the bottom surface of the substrate.

In the above substrate processing method, a rinse liquid of 30° C. to 70° C. may be used as the high-temperature rinse liquid.

In the above substrate processing method, a volatile processing liquid of 20° C. to 70° C. may be used as the volatile processing liquid, and a rinse liquid of 30° C. to 70° C. may be used as the high-temperature rinse liquid.

In the above substrate processing method, during the supplying the volatile processing liquid to the top surface of the substrate, the high-temperature rinse liquid may be supplied to the bottom surface of the substrate.

Another exemplary embodiment of the present disclosure provides a substrate processing apparatus that dries a substrate by supplying a volatile processing liquid after liquid processing of the substrate with a processing liquid, the apparatus comprising: a processing liquid supply unit configured to supply a processing liquid to the substrate; a volatile processing liquid supply unit configured to supply a volatile processing liquid onto the substrate; a substrate heating unit configured to heat the substrate; and a controller configured to control the volatile processing liquid supply unit and the substrate heating unit. In particular, the controller executes a process of supplying the processing liquid from the processing liquid supply unit to the substrate to process the substrate, a process of heating the substrate on which a liquid film of the processing liquid is formed by the substrate heating unit, a process of supplying a volatile processing liquid from the volatile processing liquid supply unit to the substrate on which the liquid film of the processing liquid is formed, a process of stopping the supply of the volatile processing liquid to the substrate from the volatile processing liquid supply unit, and a process of drying the substrate by removing the volatile processing liquid. The process of heating the substrate starts before the process of supplying the volatile processing liquid, and the substrate heating unit heats the substrate so that the surface temperature of the substrate is higher than a dew point before the surface of the substrate is exposed from the volatile processing liquid.

The substrate processing apparatus may further comprise a chemical liquid supply unit configured to supply a chemical liquid onto the substrate and a rinse liquid supply unit configured to supply a rinse liquid for removing the chemical liquid. The controller may further execute a process of supplying the chemical liquid from the chemical liquid supply unit to the substrate to process the substrate, and a process of supplying the rinse liquid from the rinse liquid supply unit to the substrate to rinse the substrate, and the process of heating the substrate may heat the substrate by using a high-temperature rinse liquid.

In the above substrate processing apparatus, the process of heating the substrate may supply the high-temperature rinse liquid to the top surface of the substrate.

In the above substrate processing apparatus, the process of heating the substrate may supply the high-temperature rinse liquid to the top surface and the bottom surface of the substrate.

In the above substrate processing apparatus, a rinse liquid of 30° C. to 70° C. may be used as the high-temperature rinse liquid.

In the above substrate processing apparatus, a volatile processing liquid of 20° C. to 70° C. may be used as the volatile processing liquid and a rinse liquid of 30° C. to 70° C. may be used as the high-temperature rinse liquid.

In the above substrate processing apparatus, during the process of supplying the volatile processing liquid to the top surface of the substrate, the high-temperature rinse liquid may be supplied to the bottom surface of the substrate.

Yet another exemplary embodiment of the present disclosure provides a substrate processing apparatus that dries a substrate by supplying a volatile processing liquid after a liquid processing of the substrate with a processing liquid, the apparatus comprising: a processing liquid supply unit configured to supply a processing liquid onto the substrate; a volatile processing liquid supply unit configured to supply a volatile processing liquid onto the substrate; a substrate heating unit configured to heat the substrate; and a computer readable recording medium in which a substrate processing program is recorded. In particular, the substrate processing program executes a process of supplying the processing liquid from the processing liquid supply unit to the substrate to process the substrate, a process of heating the substrate on which a liquid film of the processing liquid is formed by the substrate heating unit, a process of supplying a volatile processing liquid from the volatile processing liquid supply unit to the substrate on which the liquid film of the processing liquid is formed, a process of stopping the supply of the volatile processing liquid to the substrate from the volatile processing liquid supply unit, and a process of drying the substrate by removing the volatile processing liquid. The process of heating the substrate starts before the process of supplying the volatile processing liquid, and the substrate heating unit heats the substrate so that the surface temperature of the substrate is higher than a dew point before the surface of the substrate is exposed from the volatile processing liquid.

According to the exemplary embodiments of the present disclosure, since in the drying process using the volatile processing liquid, the substrate is heated so that the surface temperature of the substrate is higher than the dew point before the surface of the substrate is exposed from the volatile processing liquid, even though the surface temperature of the substrate decreases due to evaporation heat of the volatile processing liquid in the drying process, condensation is not generated on the surface of the substrate because the surface temperature of the substrate which is being dried is higher than the dew point and a watermark is not generated on the surface of the substrate thereby preventing minute particles from being attached.

Hereinafter, detailed configurations of a substrate processing apparatus, a substrate processing method used in the substrate processing apparatus, and a substrate processing program for processing a substrate in the substrate processing apparatus according to exemplary embodiments of the present disclosure will be described with reference to the accompanying drawings.

As shown in FIG. 1, a substrate processing apparatus 1 includes a substrate carrying-in/out platform 4, a substrate transporting chamber 5, and a substrate processing chamber 6. Substrate carrying-in/out platform 4 is formed at a front end portion of substrate processing apparatus 1, and carriers 3 that receives a plurality of sheets of (e.g., 25 sheets) substrates 2 (herein, semiconductor wafers) in a horizontal state are disposed in substrate carrying-in/out platform 4. Substrate transporting chamber 5 is formed at a rear portion of substrate carrying-in/out platform 4 to transport substrate 2. Substrate processing chamber 6 is formed at the rear portion of substrate transporting unit 5 to perform various processing such as cleaning or drying of substrate 2.

In substrate carrying-in/out platform 4, four carriers 3 are arranged at intervals horizontally while being closely contacted to a front side wall 7 of substrate transporting chamber 5.

Substrate transporting chamber 5 accommodates a substrate transporting device 8 and a substrate delivering platform 9 therein. Substrate transporting device 8 transports substrate 2 between any one of carriers 3 placed in substrate carrying-in/out platform 4 and substrate delivering platform 9.

Substrate processing chamber 6 accommodates a substrate transporting device 10 at the center thereof. Substrate processing units 11 to 22 are arranged at both left and right sides of substrate transporting device 10.

Substrate transporting device 10 transports substrates 2 one by one between substrate delivering platform 9 of substrate transporting chamber 5 and each of substrate processing units 11 to 22. Each of substrate processing units 11 to 22 processes substrates 2 one by one.

Figure 2:
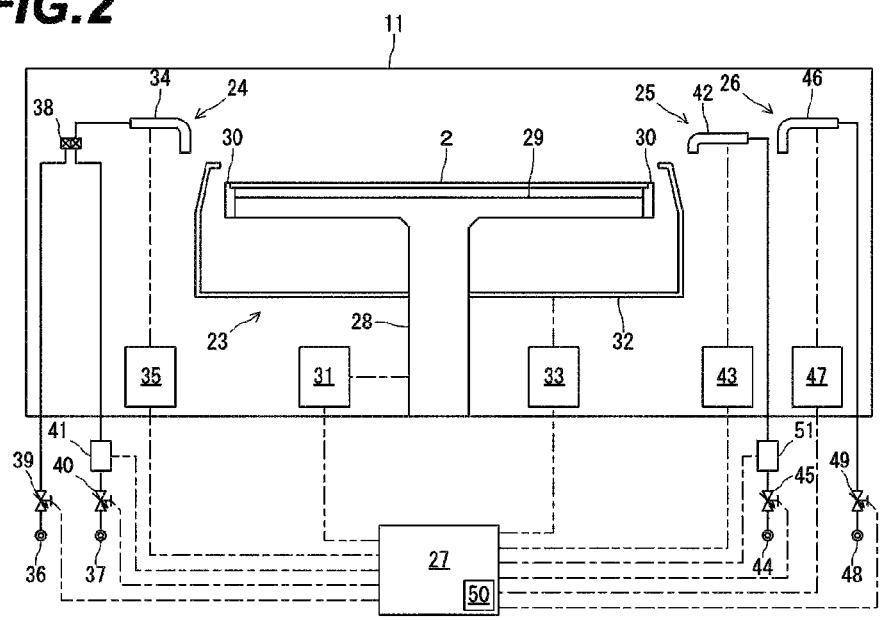
FIG. 2 is a schematic diagram illustrating a substrate processing unit.

Substrate processing units 11 to 22 each has the same configuration and the configuration of substrate processing unit 11 will be representatively described. As shown in FIG. 2, substrate processing unit 11 includes a substrate holding means 23 that rotates substrate 2 while horizontally holding substrate 2, a processing liquid supplying means 24 that ejects a processing liquid (cleaning liquid or rinse liquid) toward the top surface of substrate 2 held by substrate holding means 23, and a volatile processing liquid supplying means 25 that ejects a volatile drying liquid toward the top surface of substrate 2 held by substrate holding means 23, and an inert gas ejecting means 26 that ejects an inert gas toward the top surface of substrate 2 held by substrate holding means 23. Substrate holding means 23, processing liquid supplying means 24, volatile processing liquid supplying means 25, and inert gas ejecting means 26 are controlled by a control means 27. Control means 27 controls all the components of substrate processing apparatus 1 including substrate transporting devices 8 and 10.

Substrate holding means 23 includes a disk-shaped table 29 which is horizontally disposed at an upper end portion of a rotational shaft 28. A plurality of substrate holding bodies 30 that hold substrate 2 horizontally by being contacted with the periphery of substrate 2 are attached at intervals in a circumferential direction on the periphery of table 29. A rotation driving mechanism 31 is connected to rotational shaft 28. Rotational driving mechanism 31 rotates substrate 2 held by substrate holding bodies 30 by rotating rotational shaft 28 and table 29. Rotation driving mechanism 31 is connected to control means 27 and is rotatably-controlled by control means 27.

Substrate holding means 23 includes an elevatable cup 32 which is opened upward, around table 29. Cup 32 prevents the processing liquid or drying liquid from being scattered and recovers the processing liquid or the drying liquid by surrounding substrate 2 placed on table 29. Cup 32 is connected to an elevation mechanism 33 and elevated relatively upward and downward with respect to substrate 2 by elevation mechanism 33. Elevation mechanism 33 is connected to control means 27 and is elevatably-controlled by control means 27.

Processing liquid supplying means 24 is placed so that a processing liquid ejecting nozzle 34 is capable of being moved to a position above table 29. Processing liquid ejecting nozzle 34 is connected to a moving mechanism 35, and moves between a retracting position outside substrate 2 and an ejecting start position just above the center of substrate 2 by moving mechanism 35. Moving mechanism 35 is connected to control means 27 and is movably-controlled by control means 27.

A cleaning liquid supplying source 36 that supplies the cleaning liquid (hydrogen fluoride) to processing liquid ejecting nozzle 34 and a rinse liquid supplying source 37 that supplies the rinse liquid (deionized water) to processing liquid ejecting nozzle 34 are connected to processing liquid supplying means 24 through a changeover valve 38 which can switch between a supply of the cleaning liquid, a supply of the rinse liquid and a stop. A flow rate regulator 39 is interposed between cleaning liquid supplying source 36 and changeover valve 38, and adjusts the flow rate of the cleaning liquid supplied from processing liquid ejecting nozzle 34 to substrate 2. Flow rate regulator 39 is connected to control means 27 and the flow rate is controlled by control means 27. Meanwhile, a flow rate regulator 40 and a heater 41 as a heating means are interposed between rinse liquid supplying source 37 and changeover valve 38. Flow rate regulator 40 adjusts the flow rate of the rinse liquid supplied from processing liquid ejecting nozzle 34 to substrate 2 and heater 41 adjusts a temperature of the rinse liquid. Flow rate regulator 40 and heater 41 are connected to control means 27 and a flow rate and a temperature are controlled by control means 27. Processing liquid supplying means 24 serves as a substrate heating means because processing liquid supplying means 24 can heat the substrate 2 by supplying the rinse liquid heated by heater 41 to substrate 2.

Volatile processing liquid supplying means 25 is placed so that a drying liquid ejecting nozzle 42 is capable of being moved above table 29. Drying liquid ejecting nozzle 42 is connected to a moving mechanism 43 and moves between a retracting position outside substrate 2 and an ejecting start position right above the center of substrate 2 by moving mechanism 43. Moving mechanism 43 is connected to control means 27 and is movably-controlled by control means 27.

A drying liquid supplying source 44 that supplies the drying liquid (IPA) as a volatile processing liquid to drying liquid ejecting nozzle 42 is connected to volatile processing liquid supplying means 25 through a flow rate regulator 45 and a heater 51. Flow rate regulator 45 adjusts a flow rate of a drying liquid supplied from drying liquid ejecting nozzle 42 to substrate 2 or stops the supply of the drying liquid, and heater 51 adjusts a temperature of the drying liquid. Flow rate regulator 45 and heater 51 are connected to control means 27 and the flow rate and the temperature are controlled by control means 27.

Inert gas ejecting means 26 is placed so that an inert gas ejecting nozzle 46 is capable of being moved above table 29. Inert gas ejecting nozzle 46 is connected to a moving mechanism 47 and moves between a retracting position outside substrate 2 and an ejecting start position above the center of substrate 2 by moving mechanism 47. Moving mechanism 47 is connected to control means 27 and is movably-controlled by control means 27.

An inert gas supplying source 48 that supplies an inert gas (nitrogen gas) to inert gas ejecting nozzle 46 is connected to inert gas ejecting means 26 through a flow rate regulator 49. Flow rate regulator 49 adjusts the flow rate of the inert gas supplied from inert gas ejecting nozzle 46 to substrate 2 or stops the supply of the inert gas. Flow rate regulator 49 is connected to control means 27 and the flow rate is controlled by control means 27.

Substrate processing apparatus 1 is configured as described above and substrate 2 is processed in each of substrate processing units 11 to 22 according to a substrate processing program recorded in a recording medium 50 which is readable by control means 27 (e.g., computer). Recording medium 50 may be a medium in which various programs such as the substrate processing program may be recorded, a semiconductor memory type recording medium such as a ROM or a RAM, or a disk type recording medium such as a hard disk or a CD-ROM.

In substrate processing apparatus 1, substrate 2 is processed as described below according to the flowchart shown in FIG. 3 by the substrate processing program.

Figure 3:
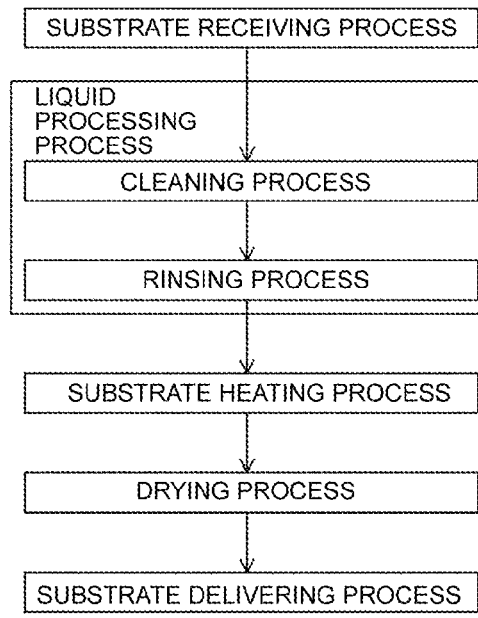
FIG. 3 is a flowchart illustrating a substrate processing method.

First, as shown in FIG. 3, the substrate processing program executes a substrate receiving process that receives substrate 2 from substrate transporting device 10 by substrate holding means 23 of each of substrate processing units 11 to 22.

Figure 4:
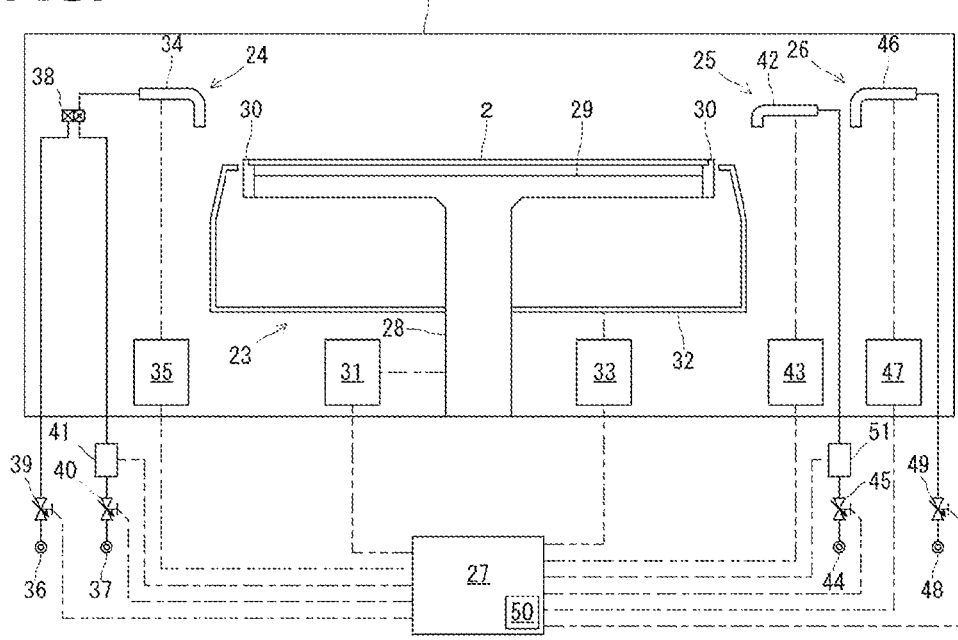
FIG. 4 is a diagram illustrating the operation of the substrate processing unit (substrate receiving process).

According to the substrate processing program in the substrate receiving process, as shown in FIG. 4, control means 27 controls elevation mechanism 33 of substrate holding means 23 to drop cup 32 to a predetermined position. Thereafter, substrate holding bodies 30 receive and hold substrate 2 from substrate transporting device 10. Thereafter, control means 27 controls elevation mechanism 33 of substrate holding means 23 to lift cup 32 up to a predetermined position.

Next, as shown in FIG. 3, the substrate processing program executes a liquid processing process that liquid processes substrate 2 received in the substrate receiving process with the processing liquid (herein, hydrogen fluoride and deionized water). In this case, the liquid processing process includes a cleaning process that cleans substrate 2 with hydrogen fluoride, and a rinsing process that removes the hydrogen fluoride from substrate 2 by supplying deionized water to substrate 2 after the cleaning process.

Figure 5:
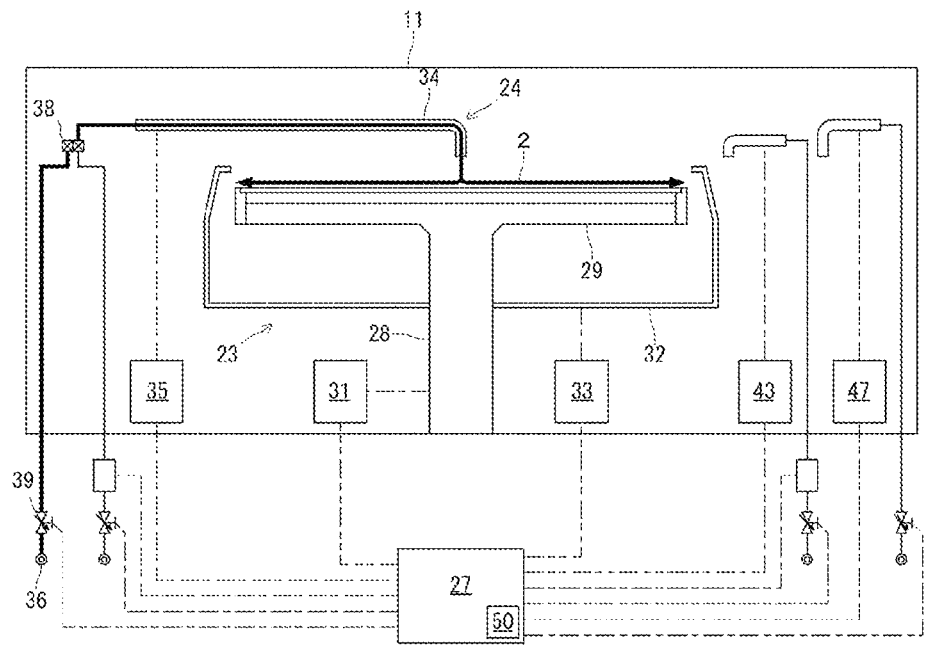
FIG. 5 is a diagram illustrating the operation of the substrate processing unit (cleaning process).

According to the substrate processing program in the cleaning process, as shown in FIG. 5, control means 27 controls rotation driving mechanism 31 to rotate table 29 of substrate holding means 23 and substrate 2 held by substrate holding bodies 30 of table 29 at a predetermined rotational speed. Control means 27 controls moving mechanism 35 to move processing liquid ejecting nozzle 34 of processing liquid supplying means 24 to a position above the center of substrate 2. Control means 27 controls opening and flow rate of flow rate regulator 39 to eject the hydrogen fluoride of the room temperature supplied from cleaning liquid supplying source 36 from processing liquid ejecting nozzle 34 toward the top surface of substrate 2 for a predetermined time. Thereafter, control means 27 closes flow rate regulator 39 to stop the ejecting of the hydrogen fluoride from processing liquid ejecting nozzle 34. Processing liquid ejecting nozzle 34 may eject the hydrogen fluoride to the center of the top surface of substrate 2 while processing liquid ejecting nozzle 34 stops above the center of substrate 2, and may eject the hydrogen fluoride to the top surface of substrate 2 while moving between an upper side of the center of substrate 2 and an upper side of an outer peripheral end edge of substrate 2 by moving mechanism 35.

Figure 6:
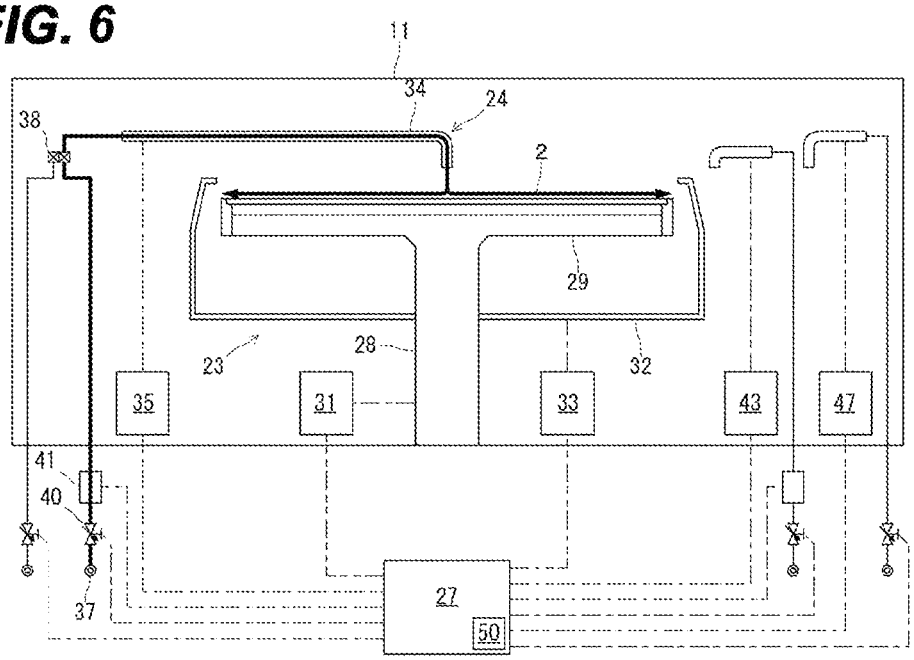
FIG. 6 is a diagram illustrating the operation of the substrate processing unit (rinsing process).

Thereafter, according to the substrate processing program in the rinsing process, as shown in FIG. 6, control means 27 controls rotation driving mechanism 31 to rotate table 29 of substrate holding means 23 and substrate 2 held by substrate holding bodies 30 of table 29 at a predetermined rotational speed. In this state, control means 27 controls moving mechanism 35 to move processing liquid ejecting nozzle 34 of processing liquid supplying means 24 to above the center of substrate 2. Control means 27 controls opening and flow rate of flow rate regulator 40 while controlling to stop the heater 41 to eject the deionized water supplied from rinse liquid supplying source 37 from processing liquid ejecting nozzle 34 to the top surface of substrate 2 for a predetermined time, in which the deionized water is not heated by heater 41 and ejected at room temperature.

Next, as shown in FIG. 3, the substrate processing program executes a substrate heating process that heats substrate 2 liquid-processed in the liquid processing process.

Figure 7:
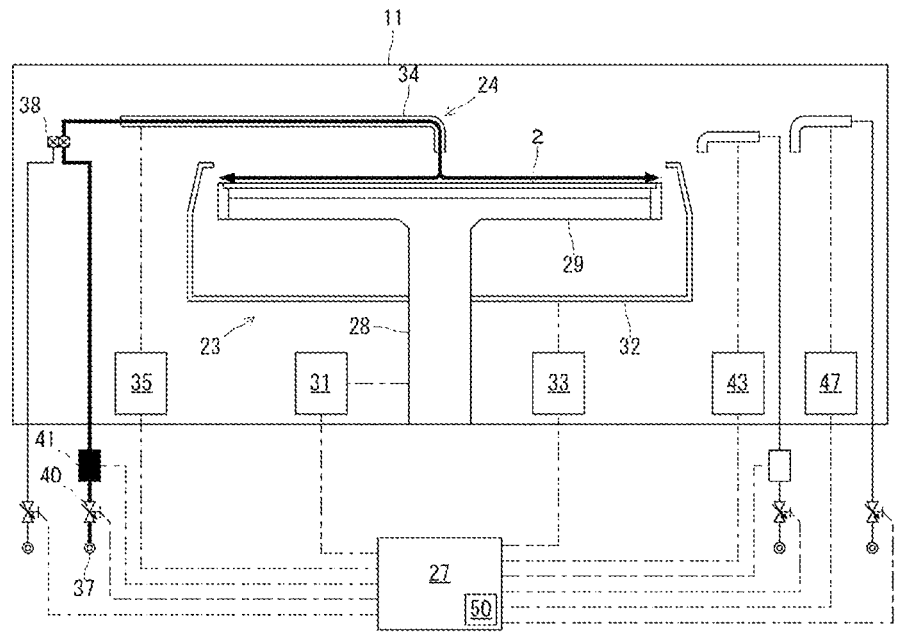
FIG. 7 is a diagram illustrating the operation of the substrate processing unit (substrate heating process).

According to the substrate processing program in the substrate heating process, as shown in FIG. 7, control means 27 controls rotation driving mechanism 31 to rotate table 29 of substrate holding means 23 and substrate 2 held by substrate holding bodies 30 of table 29 at a predetermined rotational speed. In this state, control means 27 controls driving of heater 41 and controls opening and flow rate of flow rate regulator 40 to heat deionized water supplied from rinse liquid supplying source 37 to a predetermined temperature (e.g., 60° C.) by heater 41, and eject the heated deionized water from processing liquid ejecting nozzle 34 to the top surface of substrate 2 for a predetermined time. Thereafter, control means 27 closes flow rate regulator 40 to stop the ejection of the deionized water from processing liquid ejecting nozzle 34 and stops heater 41.

As such, in the substrate heating process, substrate 2 is heated by thermal conduction by ejecting the liquid (rinse liquid) having a higher temperature than that of the processing liquid used in the liquid processing process to the top surface of substrate 2. In this case, substrate 2 is heated until the surface temperature of substrate 2 during the drying process to be described below is higher than a dew point.

In this case, the rinsing process and the substrate heating process are described as different processes, but when the high-temperature rinse liquid is ejected to the top surface of substrate 2 in the substrate heating process, the substrate heating process and the rinsing process may be performed simultaneously. Therefore, a substrate processing time in substrate processing apparatus 1 can be shortened and a throughput can be improved. Meanwhile, in the case where the use of the high-temperature rinse liquid may influence the processing in a process (herein, the cleaning process, but other processes such as an etching process may be included in this case) before the rinsing process (e.g., the case in which etching by an etching liquid progresses as the temperature of substrate 2 increases), it is possible to prevent a harmful influence which may be caused by the heating of substrate 2 by performing the rinsing process with the rinse liquid of the room temperature before the substrate heating process.

Next, as shown in FIG. 3, the substrate processing program executes a drying process that dries substrate 2 heated in the substrate heating process.

Figure 8:
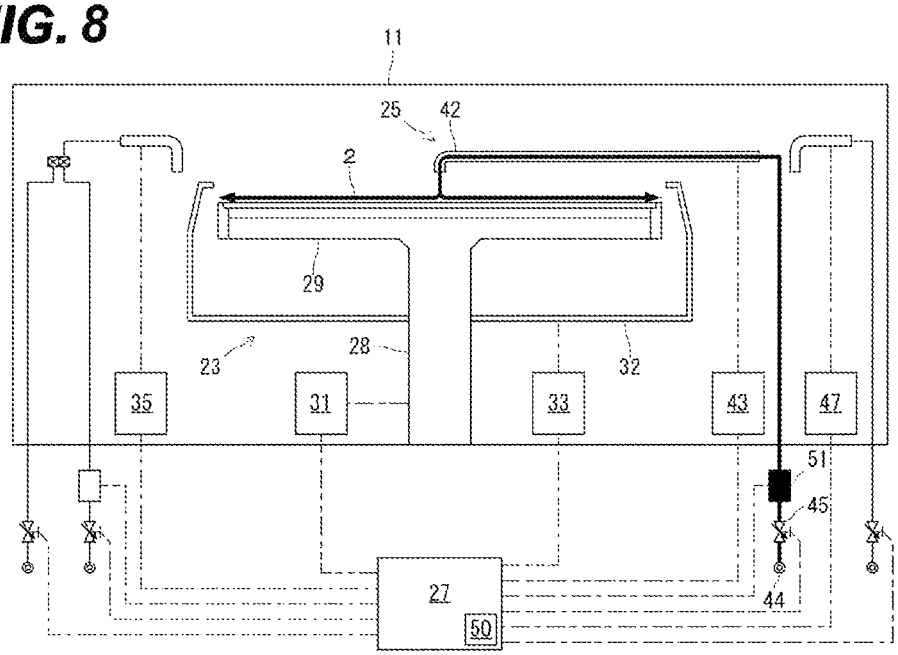
FIG. 8 is a diagram illustrating the operation of the substrate processing unit (first half of a drying process).

According to the substrate processing program in the drying process, as shown in FIG. 8, control means 27 controls rotation driving mechanism 31 to rotate table 29 of substrate holding means 23 and substrate 2 held by substrate holding bodies 30 of table 29 at a predetermined rotational speed. In this state, control means 27 controls moving mechanism 43 to move drying liquid ejecting nozzle 42 of volatile processing liquid supplying means 25 to above the center of substrate 2, and control means 27 controls opening and flow rate of flow rate regulator 45 to eject a high-temperature IPA (e.g., 50° C.) supplied from drying liquid supplying source 44 from drying liquid ejecting nozzle 42 toward the top surface of substrate 2 for a predetermined time. Similarly, drying liquid ejecting nozzle 42 may eject the high-temperature IPA to the center of the top surface of substrate 2 while drying liquid ejecting nozzle 42 stops above the center of substrate 2, and may eject the high-temperature drying liquid to the top surface of substrate 2 while moving between an upper side of the center of substrate 2 and an upper side of an outer peripheral end edge of substrate 2 by moving mechanism 43.

Figure 9:
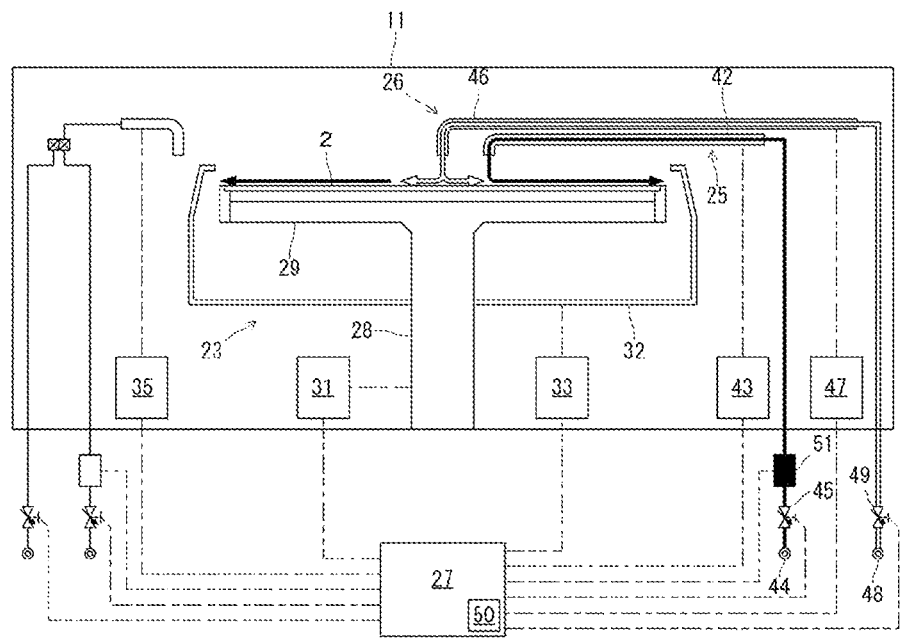
FIG. 9 is a diagram illustrating the operation of the substrate processing unit (second half of the drying process).

According to the substrate processing program in the drying process, as shown in FIG. 9, control means 27 controls rotation driving mechanism 31 to rotate table 29 of substrate holding means 23 and substrate 2 held by substrate holding bodies 30 of table 29 at a predetermined rotational speed. In this state, control means 27 controls moving mechanism 43 to move drying liquid ejecting nozzle 42 of volatile processing liquid supplying means 25 toward an upper side of an outer peripheral end edge of substrate 2. In this case, control means 27 controls moving mechanism 47 to move inert gas ejecting nozzle 46 of inert gas ejecting means 26 above the center of substrate 2 and then move inert gas ejecting nozzle 46 toward an upper side of an outer peripheral end edge of substrate 2 following drying liquid ejecting nozzle 42. Control means 27 controls opening and flow rate of flow rate regulators 45 and 49 to eject a high-temperature IPA (e.g., 50° C.) and a nitrogen gas of the room temperature supplied from drying liquid supplying source 44 and inert gas supplying source 48 from drying liquid ejecting nozzle 42 and inert gas ejecting nozzle 46 toward the top surface of substrate 2 for a predetermined time. Thereafter, control means 27 controls to close flow rate regulators 45 and 49 to stop the ejection of the IPA and the nitrogen gas from drying liquid ejecting nozzle 42 and inert gas ejecting nozzle 46.

As described above, in the drying process, the remaining moisture on the top surface of substrate 2 is substituted with the drying liquid by ejecting the volatile drying liquid toward the top surface of substrate 2 and the top surface of substrate 2 is dried by evaporating the drying liquid along with the moisture.

In this case, since the volatile drying liquid is used, evaporation heat is obtained from substrate 2 when the drying liquid is evaporated and the temperature of the entire or a portion of the surface of substrate 2 decreases. When the humidity of the air around the surface of substrate 2 is 70%, a dew point at the surface of substrate 2 is 19.1° C., while when the surface temperature of substrate 2 is the room temperature (25° C.), the surface temperature of substrate 2 decreases from the room temperature to the dew point or less due to the evaporation heat. As a result, it was verified by an experiment that the moisture in the air is condensed on the surface of substrate 2, and due to the condensation, a watermark is generated on the surface of substrate 2 and as a result, minute particles are attached.

Therefore, in the exemplary embodiment of the present disclosure, the surface of substrate 2 was heated before the surface of substrate 2 is exposed from the drying liquid so that the surface temperature of substrate 2 which is being dried is higher than the dew point by performing the substrate heating process right before the drying process (e.g., the surface of substrate 2 is heated with the rinse liquid of 60° C., so that the surface temperature of substrate 2 becomes 35° C.).

As a result, it is verified that even though the surface temperature of substrate 2 which is being dried in the drying process decreases due to the evaporation heat of the drying liquid, the surface temperature of substrate 2 is maintained higher than the dew point and no condensation is generated on the surface of substrate 2, such that a watermark is not generated on the surface of substrate 2 to prevent minute particles from being attached.

Substrate 2 may be heated so that the surface of substrate 2 which is being dried is higher than the dew point before the surface of substrate 2 is exposed from the drying liquid, but when the substrate 2 is heated by using a high-temperature liquid such as a rinse liquid, the humidity around the surface of substrate 2 increases due to the moisture of the liquid, and as a result, the dew point also increases (e.g., when the temperature is 25° C. and the humidity is 70%, the dew point is 19.1° C., while when the humidity increases to 90%, the dew point increases to 23.2° C.). That is, when substrate 2 is heated by using the liquid such as the rinse liquid, if the temperature of the liquid is very low (e.g., less than 30° C.), it is difficult for the surface temperature of substrate 2 which is being dried to be higher than the dew point, while if the temperature of the liquid is very high (e.g., above 70° C.), the humidity increases which results in an increase in the dew point, and consequently, it is difficult for the surface temperature of substrate 2 which is being dried to be higher than the dew point. Therefore, substrate 2 should be heated by using the liquid having the temperature of a predetermined range considering the increase in the dew point accompanied by the increase in the humidity. Therefore, a rinse liquid of 30° C. to 70° C. may be used as the rinse liquid, and in this case, a drying liquid of 20° C. to 70° C. may be used as the drying liquid.

Lastly, the substrate processing program executes a substrate delivering process that delivers substrate 2 from substrate holding means 23 of each of substrate processing units 11 to 22 to substrate transporting device 10, as shown in FIG. 3.

Figure 10:
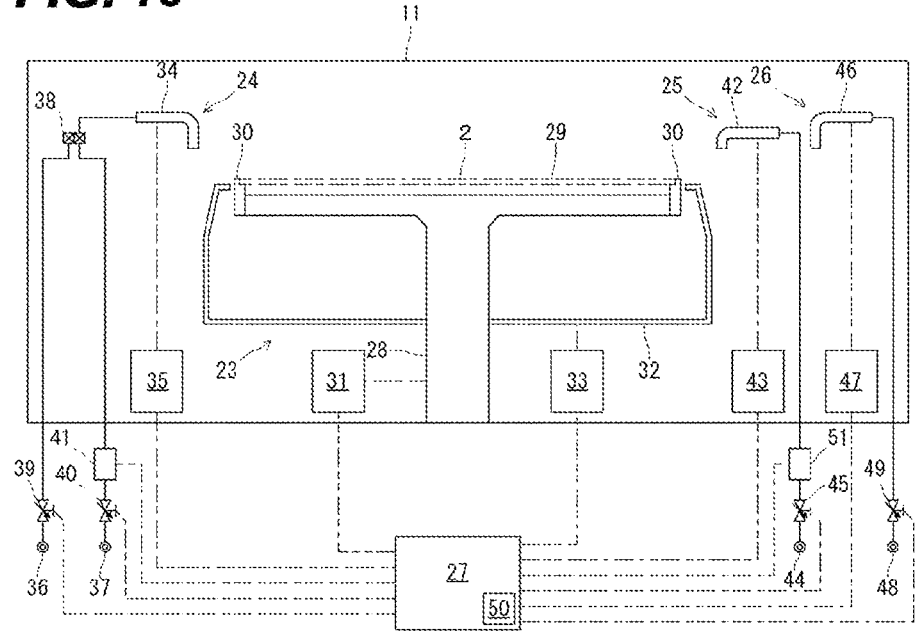
FIG. 10 is a diagram illustrating the operation of the substrate processing unit (substrate delivering process).

According to the substrate processing program in the substrate delivering process, as shown in FIG. 10, control means 27 controls elevation mechanism 33 of substrate holding means 23 to drop cup 32 to a predetermined position. Thereafter, substrate 2 held by substrate holding bodies 30 is delivered to substrate transporting device 10. Thereafter, control means 27 controls elevation mechanism 33 of substrate holding means 23 to lift cup 32 to a predetermined position. The substrate delivering process may be performed simultaneously with the previously performed substrate receiving process.

As described above, in the substrate processing method which is performed in substrate processing apparatus 1 according to the substrate processing program, a process that starts to supply the volatile processing liquid to substrate 2 and a process that stops the supply of the volatile processing liquid to substrate 2 are performed. Before stopping the supply of the volatile processing liquid to substrate 2, particularly, before the surface of substrate 2 is exposed from the drying liquid, the substrate heating process that heats the substrate is performed to heat the substrate so that the surface temperature of substrate 2 which is being dried is higher than the dew point. And then the drying process is performed.

For this reason, even though in substrate processing apparatus 1, the surface temperature of substrate 2 decreases due to the evaporation heat of the volatile drying liquid in the drying processing, the surface temperature of substrate 2 is higher than the dew point before the surface of substrate 2 is exposed from the drying liquid, such that no condensation is generated on the surface of substrate 2 and the watermark is not generated on the surface of substrate 2 to prevent minute particles from being attached.

Figure 11:
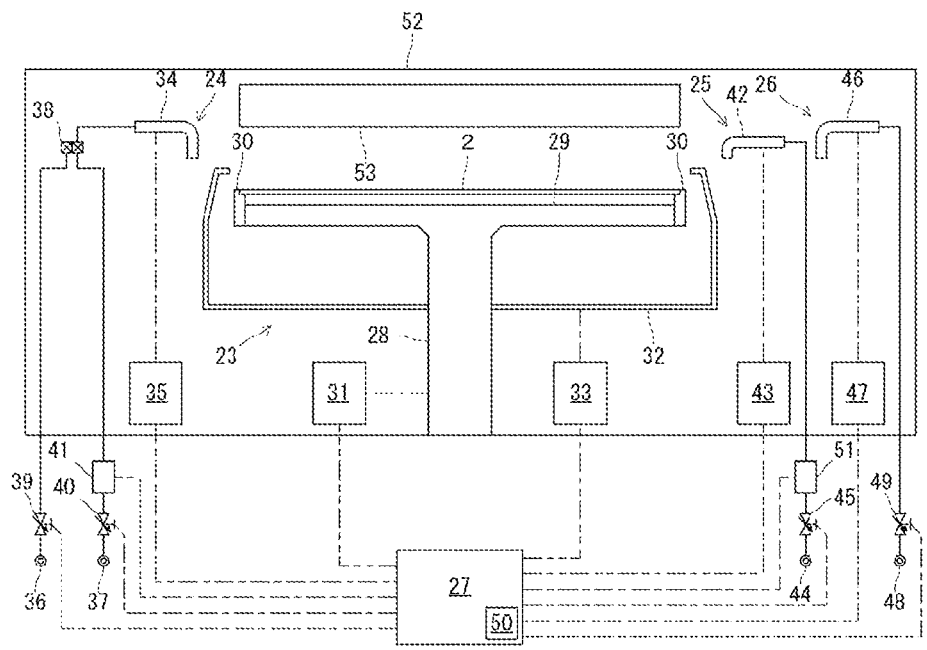
FIG. 11 is a schematic diagram illustrating another substrate processing unit.
Figure 12:
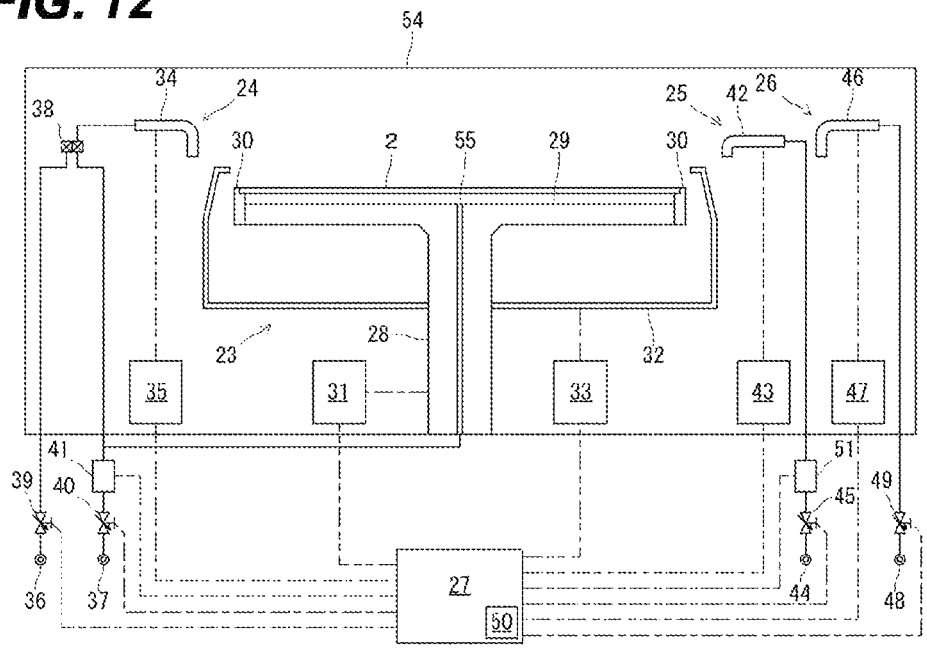
FIG. 12 is a schematic diagram illustrating yet another substrate processing unit.

In substrate processing apparatus 1, substrate 2 is heated by supplying the high-temperature rinse liquid to substrate 2 in the substrate heating process, but is not limited thereto and substrate 2 may be heated by supplying a high-temperature drying liquid to substrate 2. As shown in FIG. 11, in a substrate processing unit 52, an LED lamp 53 may be disposed above table 29 and irradiate substrate 2 to be heated. Since the temperature of substrate 2 may rapidly increase by the irradiation of LED lamp 53, the time for retaining a liquid film of the drying liquid to prevent the surface of substrate 2 from being exposed from the drying liquid may be shortened, and as a result, it is possible to suppress excess consumption of the drying liquid. Before starting to supply the drying liquid, the temperature of substrate 2 may be increased until the surface temperature is higher than the dew point. As shown in FIG. 12, in a substrate processing unit 54, an ejection hole 55 is disposed at the center of table 29 and a high-temperature liquid (herein, rinse liquid) is supplied from the ejection hole 55 to heat substrate 2 from a bottom surface of substrate 2. In the exemplary embodiments, substrate 2 is heated until the surface temperature is higher than the dew point without exposing the surface of substrate 2 by keeping the liquid film of the rinse liquid or the drying liquid on the surface of substrate 2.

In substrate processing apparatus 1 described above, the substrate heating process is performed before the drying process. However, substrate 2 may be heated before the surface of substrate 2 is exposed from the drying liquid, and the temperature of substrate 2 may not be increased until the temperature is higher than the dew point at the beginning of the drying process. That is, the substrate heating process may be performed during the drying process. For example, after the liquid processing process (rinsing process) is completed, the drying liquid may be supplied to substrate 2 and substrate 2 is heated by supplying high-temperature deionized water (e.g., 30° C. to 80° C.) to the bottom surface of substrate 2 for a predetermined time (e.g., 5 seconds) and stopping the supply of the deionized water, thereafter (e.g., after 5 seconds), an inert gas with the drying liquid may be supplied to substrate 2. In this case, the high-temperature drying liquid may be supplied to the bottom surface of the substrate 2, but in order to suppress consumption of the drying liquid, the high-temperature deionized water may be supplied. Additionally, when substrate 2 is heated until the surface temperature of substrate 2 is higher than the dew point, the supply of the high-temperature deionized water or drying liquid may be stopped.

In substrate processing apparatus 1 described above, the hydrogen fluoride is used as the cleaning liquid, the deionized water is used as the rinse liquid, and the IPA is used as the volatile processing liquid, but the examples are not limited thereto. The present disclosure may be applied to the case where another processing liquid is used or the case where another processing such as etching processing is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus that dries a substrate by supplying a volatile processing liquid after a liquid processing of the substrate with a processing liquid, the apparatus comprising:
  a processing liquid supply unit configured to supply a processing liquid to the substrate;
  a volatile processing liquid supply unit configured to supply a volatile processing liquid onto the substrate;
  a substrate heating unit configured to heat the substrate; and
  a controller configured to control the volatile processing liquid supply unit and the substrate heating unit,
  wherein the controller executes a process of supplying the processing liquid from the processing liquid supply unit to the substrate to process the substrate, a process of heating the substrate on which a liquid film of the processing liquid is formed by the substrate heating unit, a process of supplying a volatile processing liquid from the volatile processing liquid supply unit to the substrate on which the liquid film of the processing liquid is formed, a process of stopping the supply of the volatile processing liquid to the substrate from the volatile processing liquid supply unit, and a process of drying the substrate by removing the volatile processing liquid, and
  wherein the process of heating the substrate starts before the process of supplying the volatile processing liquid, and the substrate heating unit heats the substrate so that the surface temperature of the substrate is higher than a dew point before the surface of the substrate is exposed from the volatile processing liquid.

2. The substrate processing apparatus of claim 1, wherein the substrate processing apparatus further comprises a chemical liquid supply unit configured to supply a chemical liquid onto the substrate and a rinse liquid supply unit configured to supply a rinse liquid for removing the chemical liquid, and
  wherein the controller further executes a process of supplying the chemical liquid from the chemical liquid supply unit to the substrate to process the substrate, and a process of supplying the rinse liquid from the rinse liquid supply unit to the substrate to rinse the substrate, and the process of heating the substrate heats the substrate by using a high-temperature rinse liquid.

3. The substrate processing apparatus of claim 2, wherein the process of heating the substrate supplies the high-temperature rinse liquid to a top surface of the substrate.

4. The substrate processing apparatus of claim 2, wherein the process of heating the substrate supplies the high-temperature rinse liquid to the top surface and a bottom surface of the substrate.

5. The substrate processing apparatus of claim 3, wherein a rinse liquid of 30° C. to 70° C. is used as the high-temperature rinse liquid.

6. The substrate processing apparatus of claim 2, wherein a volatile processing liquid of 20° C. to 70° C. is used as the volatile processing liquid and a rinse liquid of 30° C. to 70° C. is used as the high-temperature rinse liquid.

7. The substrate processing apparatus of claim 2, wherein during the process of supplying the volatile processing liquid to a top surface of the substrate, the high-temperature rinse liquid is supplied to a bottom surface of the substrate.

8. A substrate processing apparatus that dries a substrate by supplying a volatile processing liquid after a liquid processing of the substrate with a processing liquid, the apparatus comprising:
  a processing liquid supply unit configured to supply a processing liquid onto the substrate;
  a volatile processing liquid supply unit configured to supply a volatile processing liquid onto the substrate;
  a substrate heating unit configured to heat the substrate; and
  a computer readable recording medium in which a substrate processing program is recorded,
  wherein the substrate processing program executes a process of supplying the processing liquid from the processing liquid supply unit to the substrate to process the substrate, a process of heating the substrate on which a liquid film of the processing liquid is formed by the substrate heating unit, a process of supplying a volatile processing liquid from the volatile processing liquid supply unit to the substrate on which the liquid film of the processing liquid is formed, a process of stopping the supply of the volatile processing liquid to the substrate from the volatile processing liquid supply unit, and a process of drying the substrate by removing the volatile processing liquid, and wherein the process of heating the substrate starts before the process of supplying the volatile processing liquid, and the substrate heating unit heats the substrate so that the surface temperature of the substrate is higher than a dew point before the surface of the substrate is exposed from the volatile processing liquid.

* * * * *